(12) United States Patent
Knudsen

(10) Patent No.: US 11,553,291 B2
(45) Date of Patent: Jan. 10, 2023

(54) HEARING DEVICE WITH PRINTED CIRCUIT BOARD ASSEMBLY AND OUTPUT TRANSDUCER

(71) Applicant: GN Hearing A/S, Ballerup (DK)

(72) Inventor: Emil Holm Knudsen, Copenhagen (DK)

(73) Assignee: GN HEARING A/S, Ballerup (DK)

( * ) Notice: Subject to any disclaimer, the term of this patent is extended or adjusted under 35 U.S.C. 154(b) by 0 days.

(21) Appl. No.: 17/202,349

(22) Filed: Mar. 16, 2021

(65) Prior Publication Data

US 2021/0306779 A1    Sep. 30, 2021

(30) Foreign Application Priority Data

Mar. 30, 2020  (EP) .................................... 20166548

(51) Int. Cl.
*H04R 25/00* (2006.01)
*H05K 1/14* (2006.01)

(52) U.S. Cl.
CPC ......... *H04R 25/609* (2019.05); *H04R 25/554* (2013.01); *H04R 25/602* (2013.01); *H04R 25/604* (2013.01); *H05K 1/147* (2013.01); *H04R 2225/025* (2013.01); *H04R 2225/51* (2013.01); *H05K 2201/056* (2013.01); *H05K 2201/1003* (2013.01); *H05K 2201/10037* (2013.01)

(58) Field of Classification Search
CPC .......... H04R 2225/025; H04R 2225/51; H04R 25/554; H04R 25/602; H04R 25/604; H04R 25/609; H04R 2225/57; H05K 1/147; H05K 2201/056; H05K 2201/1003; H05K 2201/10037
USPC .......................................................... 381/315
See application file for complete search history.

(56) References Cited

U.S. PATENT DOCUMENTS

| 6,456,720 B1 | 9/2002 | Brimhall et al. |
| 2011/0299713 A1* | 12/2011 | Moller ................... H04R 25/60 381/328 |
| 2016/0050474 A1 | 2/2016 | Rye et al. |
| 2017/0064830 A1* | 3/2017 | Jiang ................... H04R 1/1075 |
| 2018/0054682 A1 | 2/2018 | Shenoy et al. |
| 2018/0084353 A1 | 3/2018 | Moller et al. |

OTHER PUBLICATIONS

European Search Report dated Sep. 8, 2020 for related EP Appln. No. 20166548.6.

* cited by examiner

*Primary Examiner* — Phylesha Dabney
(74) *Attorney, Agent, or Firm* — Vista IP Law Group, LLP

(57) ABSTRACT

Disclosed is a hearing device configured to be worn in an ear of a user. The hearing device is configured to provide an audio signal to the user. The hearing device comprises a circuit assembly. The circuit assembly comprises a printed circuit board assembly. The printed circuit board assembly comprises: a first circuit board; a second circuit board; and a third circuit board interconnected with the first circuit board and the second circuit board. The circuit assembly comprises a battery, and an output transducer for providing the audio signal, wherein the printed circuit board assembly is folded about the battery and the output transducer.

18 Claims, 6 Drawing Sheets

HEARING DEVICE WITH PRINTED CIRCUIT BOARD ASSEMBLY AND OUTPUT TRANSDUCER

RELATED APPLICATION DATA

This application claims priority to, and the benefit of, European Patent Application No. EP 20166548.6 filed on Mar. 30, 2020. The entire disclosure of the above application is expressly incorporated by reference herein.

FIELD

The present disclosure relates to a hearing device configured to be worn in an ear of a user. The hearing device is configured to provide an audio signal to the user. The hearing device comprises a circuit assembly comprising a printed circuit board assembly, a battery and an output transducer.

BACKGROUND

Hearing devices are used more and more by all kinds of people. Hearing devices may be used for listening to music, having phone calls etc. Hearing devices may be hearing aids used for compensating a hearing loss of the user.

Small and compact wireless hearing devices are gaining popularity as they are easy to bring along in a bag or pocket, comfortable to wear and visually appealing.

US2016050474A discloses a circuit assembly including a printed circuit board assembly. The printed circuit board assembly includes a first circuit board, a second circuit board, and a first flexible substrate interposed between, and continuous with, the first circuit board and the second circuit board. A second flexible substrate extends from, and is continuous with, the second circuit board. One or more electronic circuits comprising electronic components are disposed along one or more of the first circuit board or the second circuit board. The printed circuit board assembly is folded about a battery, with the first circuit board adjacent to the first major face, the second circuit board adjacent to the second major face, and the first flexible substrate spanning the one or more side faces.

However, there is a need for an improved small and compact hearing device.

SUMMARY

Disclosed is a hearing device configured to be worn in an ear of a user. The hearing device being configured to provide an audio signal to the user. The hearing device comprises a circuit assembly. The circuit assembly comprises a printed circuit board assembly. The printed circuit board assembly comprises a first circuit board; a second circuit board; and a third circuit board interconnected with the first circuit board and the second circuit board. The circuit assembly comprises a battery, and an output transducer for providing the audio signal, wherein the printed circuit board assembly is folded about the battery and the output transducer.

The hearing device as disclosed provides that the printed circuit board assembly is folded about the battery and the output transducer, or wrapped around the battery and the output transducer. It saves space in the hearing device when the printed circuit board assembly can be folded around the battery and the output transducer. Thereby, the hearing device can be small and compact.

It is an advantage as this provides a space efficient packaging of the battery and output transducer.

A folded printed circuit board assembly in a hearing device may provide that more area of printed circuit board is available for adding further components, functionality etc.

It is an advantage that there is both a first, second, and third circuit board in the printed circuit board assembly, because thereby there is many circuit boards, and thus area, available for proving components and functionality. Thus, more components and functionality may be provided in the present hearing device than in other prior art hearing devices of the same small and compact size.

It is an advantage that the printed circuit board assembly in the present hearing device may be larger than in other hearing devices, because thereby the functionality and performance of the hearing device may be increased.

The hearing device may be a communication device for communication with other devices or users. The hearing device may be a headset for listening to music, performing phone calls etc. The hearing device may be a hearing aid for compensating for the user's hearing loss. The hearing device may be a noise cancellation device for reducing or cancelling noise in the surroundings. The hearing device may be an ear bud or an ear piece.

If the battery is a rechargeable battery, the battery need not be replaced by the hearing device wearer, and therefore the battery can be surrounded by or wrapped in the printed circuit board assembly together with the output transducer, as the battery will stay in the hearing device and should not be accessible for the hearing device wearer. Thus, it is an advantage that the battery shall not be accessible or replaced in the hearing device.

Small and compact hearing devices may be an advantage for many reasons. A small and compact hearing device may be cheaper to manufacture, and thereby cheaper for the user to buy. Hearing devices arranged in the outer ear will often cause discomfort for the user after long term use, by making the electronic components of the hearing aid more compact, the hearing device itself can be made smaller, whereby the user may feel more comfort wearing the hearing device. Further, a small and compact hearing device may be more visually attractive/appealing for the users to wear, and thereby the user may be more satisfied with wearing the hearing device, and the user may use/wear the hearing device more often. A small and compact hearing device may be more pleasant for the user to wear, as the small size and possible low weight due to the small size, may be more comfortable in the user's ear. A small and compact hearing device may be easier for the user to carry, e.g. in a bag or pocket.

Furthermore, a small and compact hearing device can be an advantage, because people wearing the hearing device may prefer a small hearing device such that it is too visible that the person is wearing a hearing device. This may be the case if the hearing device is a hearing aid, and the person wishes to hide that he/she is wearing a hearing aid.

The hearing device is configured to be worn in an ear of a user. The hearing device may be arranged in the outer ear of the user. The hearing device may be arranged outside the ear canal of the user. The hearing device may be arranged at the concha of the ear. The hearing device may be arranged adjacent the tragus of the ear.

The hearing device is configured to provide an audio signal to the user. The audio signal may be provided to the user's ear canal through the output transducer in the hearing device. The audio signal may be processed in a processing unit of the hearing device. The audio signal may be inputted in the hearing device through a microphone in the hearing device, for example if the hearing device is a hearing aid for compensating a hearing loss of the user. The audio signal may be inputted in the hearing device through streaming from or connection to another device, such as from a telephone, mobile phone, electronic device etc. The audio signal may be sounds, surrounding sounds, speech from other people, music, a telephone call, media streaming etc.

The hearing device comprises a circuit assembly. The circuit assembly may comprise an electronic circuit. The circuit assembly may be composed of individual electronic components, such as resistors, transistors, capacitors, inductors and diodes, connected by conductive wires or traces through which electric current can flow. The combination of components and wires allows various simple and complex operations to be performed: signals can be amplified, computations can be performed, and data can be moved from one place to another.

The circuit assembly comprises a printed circuit board assembly. The printed circuit board (PCB) mechanically supports and electrically connects the electrical or electronic components using conductive tracks, pads and other features etched from one or more sheet layers of copper laminated onto and/or between sheet layers of a non-conductive substrate. The components may be soldered onto the PCB to both electrically connect and mechanically fasten them to it. The printed circuit board may comprise more layers, such as six layers.

The printed circuit board assembly comprises: a first circuit board; a second circuit board; a third circuit board interconnected with the first circuit board and the second circuit board. Thus, the printed circuit board assembly comprises three circuit boards which are connected, such as interconnected, with each other. There may be different ways by which the three circuit boards can be connected to each other. The three circuit boards may be different circuit boards, such as printed circuit boards and/or flexible circuit boards.

If the circuit board is a flexible circuit board, there may be e.g. 2 layers of material. A flexible circuit board is flexible and bendable. A flexible circuit board may be made of soft and bendable plastic or other flexible material.

The third circuit board may be shaped in different ways depending on which of the other circuit boards the third circuit board is connected to and in what configuration. The third circuit board may for example be cross-shaped, T-shaped, or straight. The first and/or second circuit boards may be shaped as traditional printed circuit boards, e.g. rectangular, oval, circular etc.

The printed circuit board assembly, when unfolded, may have a length in a first direction of less than 30 mm, such as less than 25 mm, such as less than 20 mm, such as less than 15 mm, such as less than 10 mm. The printed circuit board assembly, when unfolded, may have a length in a second direction of less than 30 mm, such as less than 25 mm, such as less than 20 mm, such as less than 15 mm, such as less than 10 mm. The first direction of the printed circuit board assembly may be perpendicular to the second direction of the printed circuit board assembly.

Each of the individual circuit boards, i.e. the first and/or second circuit board may each have a length in a first direction of less than 15 mm, such as less than 10 mm, such as less than 5 mm, such as less than 2.5 mm. Each of the individual circuit boards, i.e. the first, second, and/or third circuit board may each have a length in a second direction of less than 15 mm, such as less than 10 mm, such as less than 5 mm, such as less than 2.5 mm. The first direction of each circuit board may be perpendicular to the second direction of the circuit board.

The circuit assembly comprises a battery. The battery provides power to the circuit assembly and thus to the hearing device. The battery may be a rechargeable battery, which shall not be replaced in the hearing device, but which can remain in the hearing device for the entire life time of the hearing device, or for more years etc. The battery may be recharged by placing the hearing device with the battery in a charging device, such as a charging case. The rechargeable battery may be a lithium-ion battery, a silver-zinc battery, etc. The battery may be shaped as a cylinder. The battery may be shaped as a rectangular box. The battery may be a disc-shaped battery. The battery may be button-type battery. The battery may be flat. The battery may have a length/diameter of less than 10 mm, such as less than 8 mm, such as less than 6 mm, such as less than 4 mm. The battery may have a height/thickness of less than 10 mm, such as less than 8 mm, such as less than 6 mm, such as less than 4 mm, such as less than 2 mm.

The circuit assembly comprises an output transducer for providing the audio signal. The output transducer may be a speaker, a loudspeaker, a receiver, a dynamic driver, a balanced armature etc.

The printed circuit board assembly is folded about the battery and the output transducer. Thus, the output transducer and battery are provided within or inside the folded printed circuit board assembly.

The battery comprises one or more sides, faces or surfaces. The output transducer comprises one or more sides, faces or surfaces. The printed circuit board assembly covers at least a part of the one or more faces of the battery. The printed circuit board assembly covers at least a part of the one or more faces of the output transducer. One circuit board of the printed circuit board assembly may cover at least a part of one face of the battery. Another circuit board of the printed circuit board assembly may cover at least a part of another face of the battery, etc. One circuit board of the printed circuit board assembly may cover at least a part of one face of the output transducer. Another circuit board of the printed circuit board assembly may cover at least a part of another face of the output transducer, etc.

At least a part of the printed circuit board assembly may be flexible or bendable. At least a part of the printed circuit board assembly can be bended. Thereby, the printed circuit board assembly can be folded about the battery and the output transducer. When the printed circuit board assembly, the output transducer and the battery are arranged in the hearing device, the printed circuit board assembly is folded about the battery and the output transducer. When the printed circuit board assembly, the output transducer and the battery are not arranged in the hearing device, the printed circuit board assembly may not be folded, but may be outstretched, straight or flat.

In some embodiments the first and second circuit boards are printed circuit boards. In some embodiments the third circuit board is a flexible circuit board. The printed circuit boards may comprise more layers, such as six layers. The printed circuit board may be hard. The printed circuit boards may comprise electronic components, such as resistors, transistors, capacitors, inductors and diodes, connected by conductive wires or traces through which electric current can flow. The flexible circuit board may comprise one or more layers, such a two layers. The flexible circuit board is flexible and bendable. The flexible circuit board is soft and may not break if bended. The flexible circuit board may comprise conductive wires or traces through which electric current can flow. One or more of the printed circuit boards are connected with the flexible circuit board. The conductive wires or traces of one or more of the printed circuit boards are connected with or extends as the conductive wires or traces of the flexible circuit board.

In some embodiments the first circuit board and second circuit board are arranged opposite each other. When the printed circuit board assembly is folded about the battery and the output transducer, the first circuit board and the second circuit board may be arranged opposite each other.

In some embodiments the battery comprises a first major face, a second major face and one or more side faces; and wherein the printed circuit board assembly is folded about the battery with the first circuit board adjacent the first major face, the second circuit board adjacent the second major face, and the third circuit board adjacent at least one of the one or more side faces.

Thus, the first major face and the second major face of the battery may be opposite each other. The third circuit board may be adjacent at least one of the one or more side faces of the battery. The battery may be shaped as a cylinder. The cylinder may be a circular cylinder, and/or a right cylinder. The first and second major face of the battery may correspond to the two bases of a cylinder. The side face of the battery may correspond to the lateral area of a cylinder. If the battery is shaped as a cylinder, the battery may only have one side face, and the third circuit board is adjacent a part of the side face of the battery.

The surface of the circuit board pointing towards the battery, when the printed circuit board assembly is folded about the battery and the output transducer, may be the second surface of the circuit board. The surface of the circuit board pointing towards the surroundings, when the printed circuit board assembly is folded about the battery and the output transducer, may be the first surface of the circuit board. Thus, the second surface of the first circuit board is opposite the second surface of the second circuit board. The second surface of the first circuit board may be adjacent the first major face of the battery. The second surface of the second circuit board may be adjacent the second major face of the battery.

In some embodiments the output transducer is provided adjacent the third circuit board. The output transducer is provided within the folded printed circuit board assembly adjacent the third circuit board. Thereby the output transducer may be provided closest to the front of the ear or closest to the ear canal for providing optimal sound.

In some embodiments, the output transducer and the battery are aligned between the first and the second circuit board. Both the battery and the output transducer may be arranged within the boundaries of the folded printed circuit board, thus both the battery and the output transducer may fit within the boundaries of the first and second circuit boards. The battery and the output transducer may be aligned in a longitudinal direction and/or in a transversal direction of the printed circuit board assembly.

In some embodiments the output transducer is arranged adjacent at least one of the one or more side faces of the battery.

In some embodiments the output transducer is arranged between the battery and the third circuit board.

In some embodiments the hearing device further comprises a magnetic induction coil. In some embodiments the magnetic induction coil is provided opposite the output transducer. In some embodiments the battery is arranged between the magnetic induction coil and the output transducer. The magnetic induction (MI) coil may be a magnetic antenna. The MI coil may be provided adjacent the battery. Thereby the magnetic induction coil is shielded from electromagnetic noise from the output transducer, both due to distance and due to the battery provided in between.

The magnetic induction coil may be configured for wireless communication. The magnetic induction coil may be configured to operate at a frequency below 100 MHz, such as at below 30 MHz, such as below 15 MHz, during use. The magnetic induction coil may be configured to operate at a frequency range between 1 MHz and 100 MHz, such as between 1 MHz and 15 MHz, such as between 1 MHz and 30 MHz, such as between 5 MHz and 30 MHz, such as between 5 MHz and 15 MHz, such as between 10 MHz and 11 MHz, such as between 10.2 MHz and 11 MHz. The frequency may further include a range from 2 MHz to 30 MHz, such as from 2 MHz to 10 MHz, such as from 2 MHz to 10 MHz, such as from 5 MHz to 10 MHz, such as from 5 MHz to 7 MHz.

In some embodiments the output transducer comprises a protrusion for providing a sound output. In some embodiments the second circuit board comprises a hole and wherein the protrusion extends through the hole. The hole in the second circuit board may be an opening, through hole etc. Alternatively, the protrusion extends through a hole in the third circuit board, or an in a fourth or fifth circuit board. Alternatively there is no hole in a circuit board, and then the protrusion may extend to an open side of the folded printed circuit board assembly. Furthermore, a tube may be attached to the protrusion for directing the sound through the hearing device into the ear canal of the user.

The printed circuit board assembly may be a rigid-flex circuit, i.e. a hybrid construction flex circuit consisting of rigid and flexible substrates which are laminated together into a single structure. The first, second, fourth, and/or fifth circuit board(s) may be rigid circuit board(s), while the third circuit board is flexible, whereby the flexible structure of the third circuit board allows the printed circuit board assembly to be folded about the battery. The third circuit board has a thickness (t). The bend radius of the third circuit board may be smaller than 5 mm or smaller than 150x(t).

Alternatively, the third circuit board may also be a rigid circuit board, and the first, second, third, fourth, and/or fifth circuit board(s) may be interconnected by means of flexible sections with a bend radius of less than 5 mm. In an embodiment, the first, second, fourth, and/or fifth circuit board(s) have a larger bend radius than the third printed circuit board and/or than the flexible sections.

In some embodiments, the hearing device further comprises a frame for suspending the output transducer within the printed circuit board assembly. Thus, the output transducer may be attached and fixed in a frame.

In some embodiments the frame comprises foam surrounding the output transducer. The foam is configured for dampening vibrations from the output transducer.

In some embodiments the hearing device further comprises one or more microphones and/or one or more control interfaces. In some embodiments, the one or more microphones and/or the one or more control interfaces are provided at the first circuit board. The microphones may be configured for receiving sound from the surroundings. The received sound may be processed in a processing unit of the hearing device and provided to the output transducer of the hearing device. If the hearing device is a hearing aid, the sound received in the microphone(s) may be processed for compensating for a hearing loss of the user. The control interfaces may be configured for controlling functions of the hearing device, e.g. sound volume, modes etc. The control interface may be provided as buttons on the external surface of the hearing device.

In some embodiments the hearing device further comprises an antenna comprising an antenna element, the antenna being configured for emission and reception of electromagnetic radiation at a wavelength ($\lambda$). In some embodiments the hearing device further comprises a wireless communication unit interconnected with the antenna element. The wireless communication unit may be a radio, such as a radio frequency (RF) radio. The wireless communication device may be provided at the second circuit board.

In some embodiments the antenna element has a first end connected to a feed, wherein the feed is provided in a portion of the first or third circuit board which is adjacent to the interconnection between the first and third circuit boards. The feed may be a feeding point or excitation point. Alternatively, the antenna element may be printed on a faceplate of the hearing device and connected to the feed. The connection may be via a wire or spring.

It is an advantage that the feed of the antenna or antenna element is provided in a portion of the first or third circuit board which is adjacent the interconnection between the first and third circuit boards. Thereby the antenna element may excite a mode on the printed circuit board assembly. Furthermore, the third circuit board may be a high-current or a maximum-current area. In other words, the printed circuit board assembly may be considered to be part of the antenna, and the current distribution of the antenna may have a maximum current at the third circuit board. It is an advantage as this provides an improved antenna performance. Thus, it is an advantage that a hearing device with increased wireless communication capabilities is provided.

In some embodiments, during operational use of the hearing device, the circuit assembly is arranged such that the third circuit board is provided adjacent the tragus in the ear. This arrangement provides improved antenna performance.

In some embodiments, during operational use of the hearing device, the circuit assembly is arranged such that a first surface of the first circuit board faces towards the surroundings outside of the ear, and a second surface of the first circuit board faces towards the concha of the ear, where the first surface is opposite to the second surface. This arrangement provides improved antenna performance. The second surface of the first circuit board also faces towards the battery.

In some embodiments, the hearing device further comprises a fourth circuit board and power management components, wherein the power management components are provided at the fourth circuit board. The fourth circuit board may be provided opposite the MI coil. Alternatively, the power management may be arranged on the third circuit board. Thus, the battery and the output transducer may be provided between the MI coil and the power management components on the fourth circuit board. Thereby the magnetic induction coil is shielded from electromagnetic noise from the power management components, both due to the distance and due to the battery provided in between.

The hearing device may be a headset or earbud(s) for audio communication. The hearing device may be a hearing protector for protection of e.g. impulse sounds. The hearing device may be a hearing aid for compensating for a hearing loss of the user.

The hearing aid may be any hearing aid, such as a hearing aid of the in-the-ear type, such as in-the-canal type, such as completely-in-the-canal type of hearing aid, etc., a hearing aid of the receiver-in-the-ear type of hearing aid, etc.

The hearing device may comprise a microphone configured for converting an acoustic sound signal from a sound source into an audio signal. The audio signal is configured to be processed in a processing unit for compensation of the hearing loss of the user. The processed audio signal is configured to be converted into a processed acoustic signal by the output transducer.

The hearing device may comprise one or more antennas for radio frequency communication. The one or more antennas may be configured to operate in a first frequency range, such as at a frequency above 800 MHz, such as at a frequency above 1 GHz, such as at a frequency of 2.4 GHz, such as at a frequency between 1.5 GHz and 3 GHz, during use. Thus, the first antenna may be configured for operation in ISM frequency band. The first antenna may be any antenna capable of operating at these frequencies, and the first antenna may be a resonant antenna, such as monopole antenna, such as a dipole antenna, etc. The resonant antenna may have a length of lambda/4 or any multiple thereof, lambda being the wavelength corresponding to the emitted electromagnetic field.

The hearing device may comprise one or more wireless communications unit(s) or radios. The one or more wireless communications unit(s) are configured for wireless data communication, and in this respect interconnected with the one or more antennas for emission and reception of an electromagnetic field. Each of the one or more wireless communication unit may comprise a transmitter, a receiver, a transmitter-receiver pair, such as a transceiver, a radio unit, etc. The one or more wireless communication units may be configured for communication using any protocol as known for a person skilled in the art, including Bluetooth, WLAN standards, manufacture specific protocols, such as tailored proximity antenna protocols, such as proprietary protocols, such as low-power wireless communication protocols, RF communication protocols, magnetic induction protocols, etc. The one or more wireless communication units may be configured for communication using same communication protocols, or same type of communication protocols, or the one or more wireless communication units may be configured for communication using different communication protocols.

The hearing device may be a binaural hearing device. The hearing device may be a first hearing device and/or a second hearing device of a binaural hearing device.

The hearing device may be a device configured for communication with one or more other device, such as configured for communication with another hearing device or with an accessory device or with a peripheral device.

The present disclosure relates to different aspects including the hearing device described above and in the following, and corresponding system parts, methods, devices, systems, networks, kits, uses and/or product means, each yielding one or more of the benefits and advantages described in connection with the first mentioned aspect, and each having one or more embodiments corresponding to the embodiments described in connection with the first mentioned aspect and/or disclosed in the appended claims.

BRIEF DESCRIPTION OF THE DRAWINGS

The above and other features and advantages will become readily apparent to those skilled in the art by the following detailed description of exemplary embodiments thereof with reference to the attached drawings, in which.

DETAILED DESCRIPTION

Figure 1:
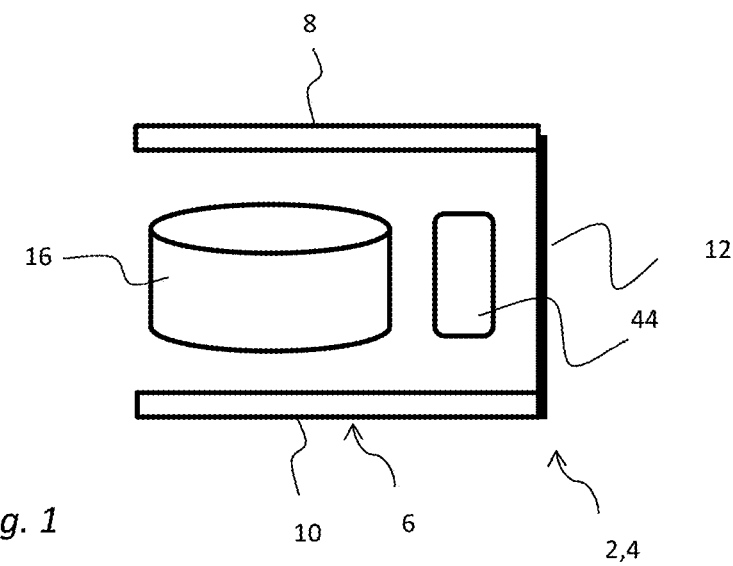
FIG. 1 schematically illustrates an example of a hearing device configured to be worn in an ear of a user.

Various embodiments are described hereinafter with reference to the figures. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

Throughout, the same reference numerals are used for identical or corresponding parts.

FIG. 1 schematically illustrates an example of a hearing device 2 configured to be worn in an ear of a user. The hearing device 2 is configured to provide an audio signal to the user. The hearing device 2 comprises a circuit assembly 4. The circuit assembly 4 comprises a printed circuit board assembly 6. The printed circuit board assembly 6 comprises: a first circuit board 8; a second circuit board 10; and a third circuit board 12 interconnected with the first circuit board 8 and the second circuit board 10. The circuit assembly 4 comprises a battery 16 and an output transducer 44 for providing the audio signal. The printed circuit board assembly 6 is folded about the battery 16 and the output transducer 44.

The battery 16 comprises a first major face, a second major face and one or more side faces. The printed circuit board assembly 6 is folded about the battery 16 with the first circuit board 8 adjacent the first major face, the second circuit board 20 adjacent the second major face, and the third circuit board 12 adjacent the one or more side faces.

The first circuit board 8 and the second circuit board 10 are opposite to each other when the printed circuit board assembly 6 is folded about the battery 16.

The output transducer 44 is provided adjacent the third circuit board 12.

The output transducer 44 and the battery 16 are aligned between the first 8 and the second circuit board 10.

The output transducer 44 is arranged adjacent at least one of the one or more side faces of the battery 16.

The output transducer 44 is arranged between the battery 16 and the third circuit board 12.

Figure 2:
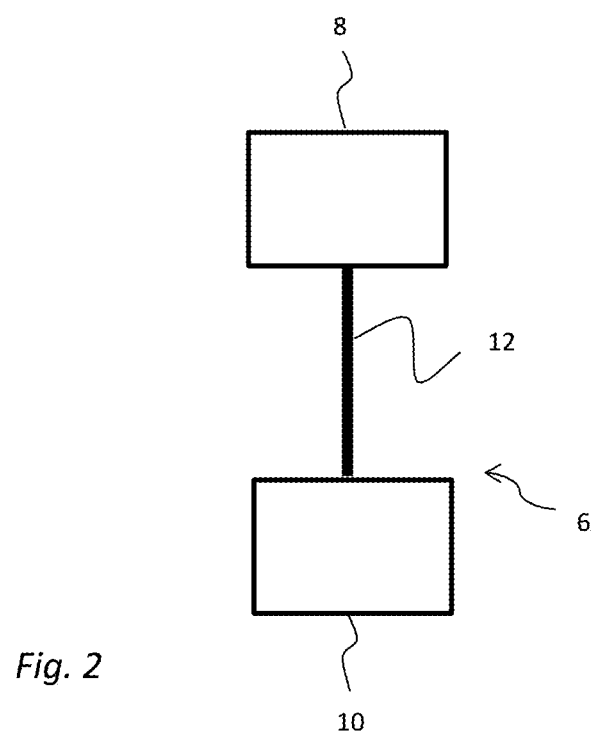
FIG. 2 schematically illustrates an example of a printed circuit board assembly when unfolded.

FIG. 2 schematically illustrates an example of a printed circuit board assembly 6 when unfolded. In FIG. 1, the printed circuit board assembly is illustrated as folded around the battery and the output transducer. The printed circuit board assembly 6 comprises a first circuit board 8; a second circuit board 10; and a third circuit board 12 interconnected with the first circuit board 8 and the second circuit board 10.

Figure 3:
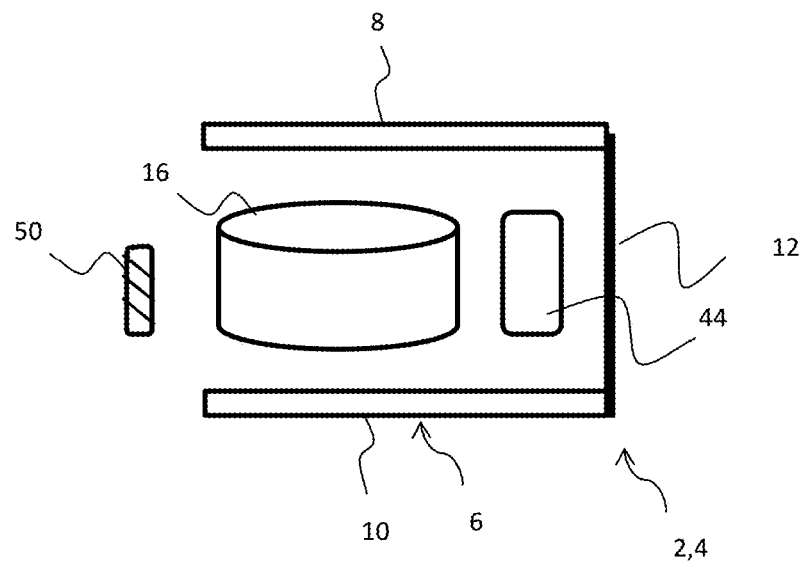
FIG. 3 schematically illustrates an example of a hearing device configured to be worn in an ear of a user.

FIG. 3 schematically illustrates an example of a hearing device 2 configured to be worn in an ear of a user. The hearing device 2 is configured to provide an audio signal to the user. The hearing device 2 comprises a circuit assembly 4. The circuit assembly 4 comprises a printed circuit board assembly 6. The printed circuit board assembly 6 comprises: a first circuit board 8; a second circuit board 10; and a third circuit board 12 interconnected with the first circuit board 8 and the second circuit board 10. The circuit assembly 4 comprises a battery 16 and an output transducer 44 for providing the audio signal. The printed circuit board assembly 6 is folded about the battery 16 and the output transducer 44.

The hearing device 2 comprises a magnetic induction coil 50. The magnetic induction coil 50 is provided opposite the output transducer 44. The battery 16 is arranged between the magnetic induction coil 50 and the output transducer 44.

Figure 4A:
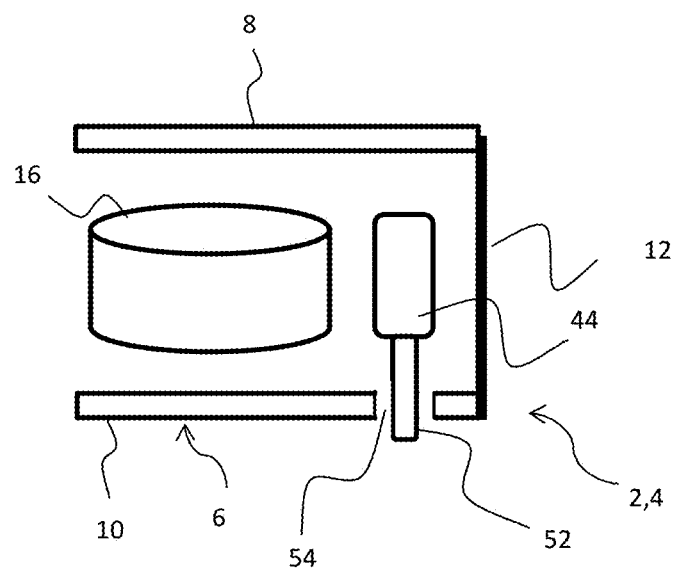
FIG. 4a), b), and c) schematically illustrates an example of a hearing device configured to be worn in an ear of a user.

FIG. 4a), b) and c) schematically illustrates an example of a hearing device 2 configured to be worn in an ear of a user. The hearing device 2 is configured to provide an audio signal to the user. The hearing device 2 comprises a circuit assembly 4. The circuit assembly 4 comprises a printed circuit board assembly 6. The printed circuit board assembly 6 comprises: a first circuit board 8; a second circuit board 10; and a third circuit board 12 interconnected with the first circuit board 8 and the second circuit board 10. The circuit assembly 4 comprises a battery 16 and an output transducer 44 for providing the audio signal. The printed circuit board assembly 6 is folded about the battery 16 and the output transducer 44.

FIGS. 4a) and 4b) shows that the output transducer 44 comprises a protrusion 52 for providing a sound output. The second circuit board 10 comprises a hole 54. The protrusion 52 extends through the hole 54.

Figure 4B:
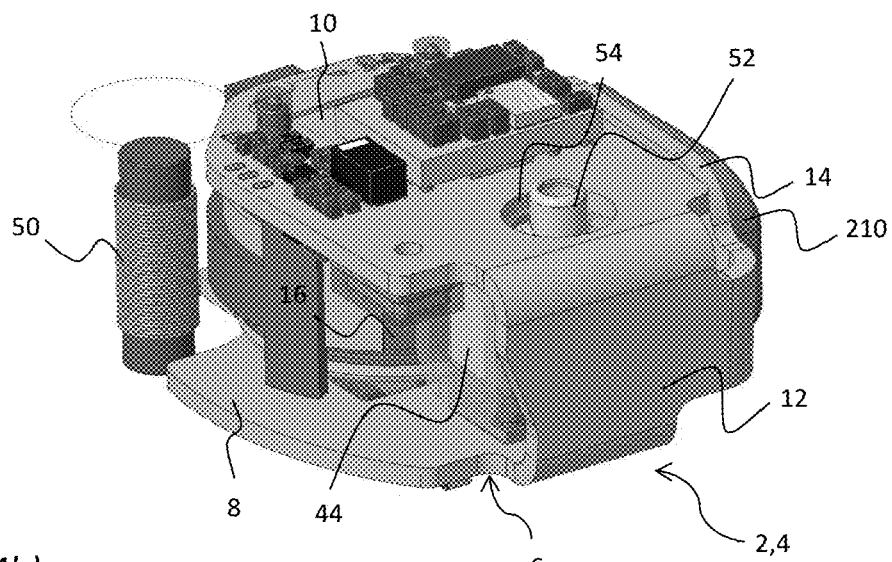
Figure 4C:
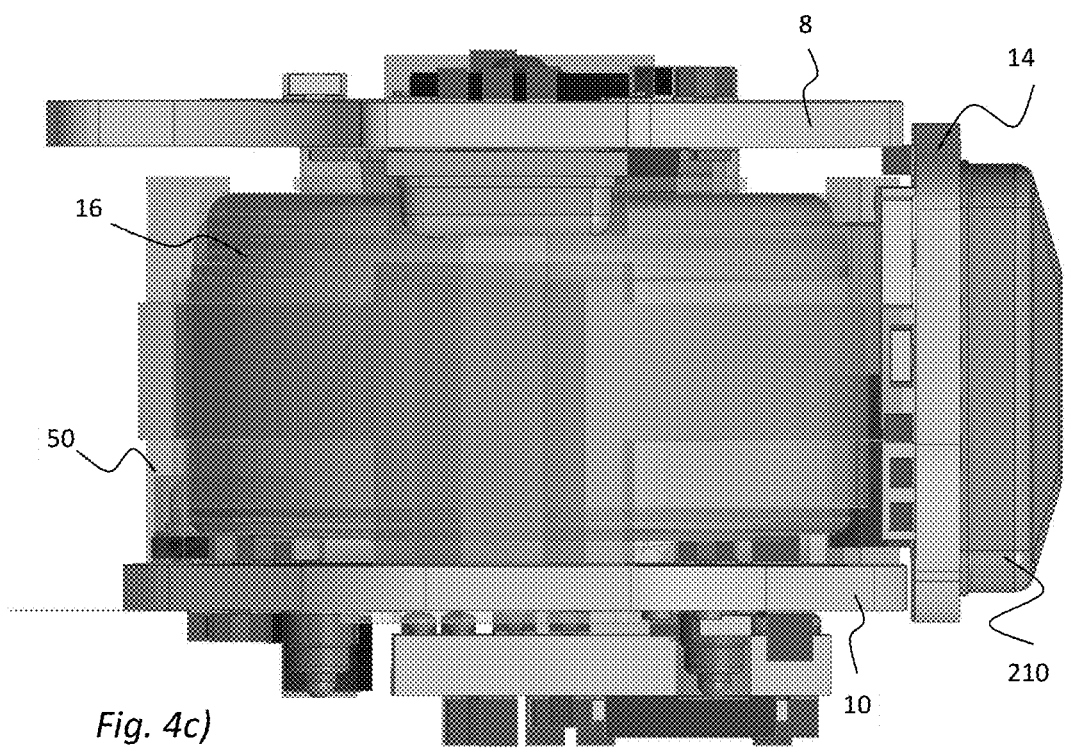

FIGS. 4b) and 4c) shows a power management component 210 provided on the fourth circuit board 14.

FIGS. 4b) and 4c) shows a magnetic induction coil 50.

FIG. 4b) shows that the magnetic induction coil 50 is provided opposite the output transducer 44. The battery 16 is arranged between the magnetic induction coil 50 and the output transducer 44.

Figure 5:
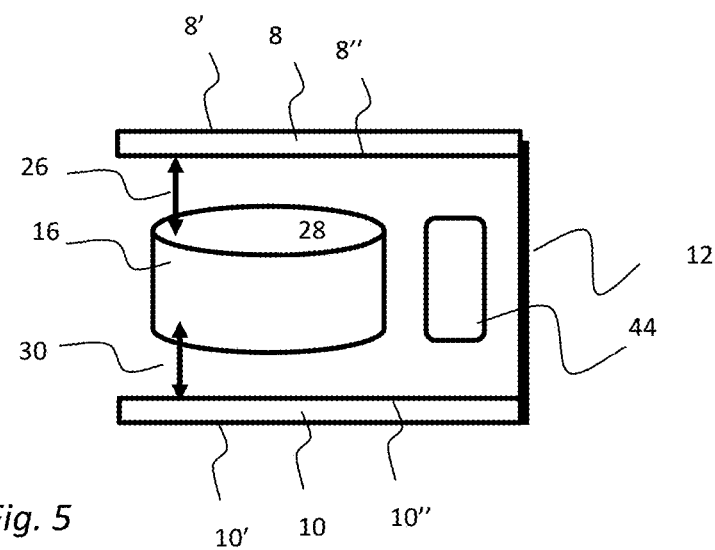
FIG. 5 schematically illustrates an example of a first distance between the first major face of the battery and the first circuit board.

FIG. 5 schematically illustrates an example of a first distance 26 between the first major face 28 of the battery 16 and the first circuit board 8. The first distance 26 may have a first predefined value.

FIG. 5 further illustrates a second distance 30 between the second major face (not shown, as it is the face of the battery pointing downwards in the figure) of the battery 16 and the second circuit board 10. The second distance 30 may have a second predefined value.

The first 26 and second 30 distance provides an air gap between the respective circuit board 8, 10 and the battery 16. The surface of the respective circuit board 8, 10 pointing towards the battery 16, when the printed circuit board assembly 6 is folded about the battery 16 and the output transducer 44, is the second surface 8", 10" of the respective circuit board 8, 10. The surface of the respective circuit board 8, 10 pointing towards the surroundings, when the printed circuit board assembly 6 is folded about the battery 16 and the output transducer 44, is the first surface 8', 10' of the respective circuit board 8, 10. Thus, the second surface 8" of the first circuit board 8 is opposite the second surface 10" of the second circuit board 10. The first distance 26 is between the first major face 28 of the battery 16 and the second surface 8" of the first circuit board 8. The second distance 30 is between the second major face of the battery 16 and the second surface 10" of the second circuit board 10. The first distance 26 and/or the second distance 30 may be 200-400 micrometer, preferably about 300 micrometer.

Figure 6:
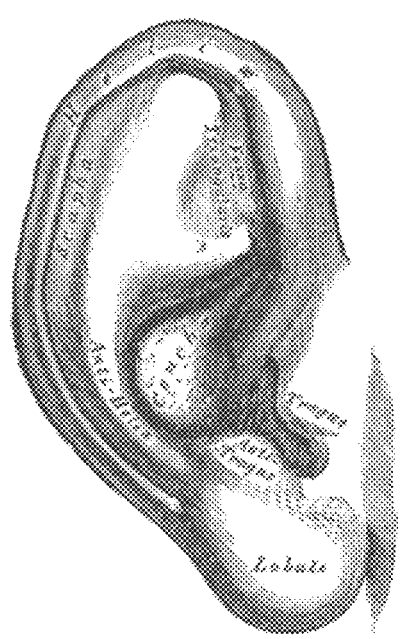
FIG. 6 left side shows an illustration of ear anatomy.
Figure 6:
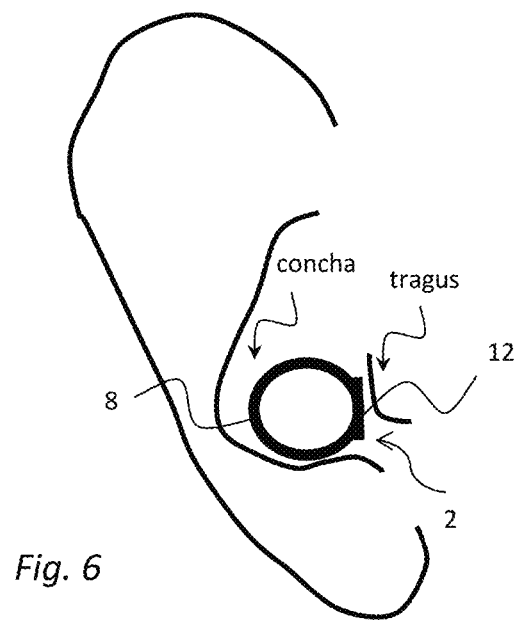

FIG. 6 left side shows an illustration of ear anatomy. FIG. 6 right side schematically illustrates an example where during operational use of the hearing device 2, the circuit assembly 4 is arranged such that the third circuit board 12 is provided adjacent the tragus in the ear. The first circuit board 8 of the printed circuit board assembly 6 of the circuit assembly 4 is configured to point outwards to the surroundings. The second circuit board 10 is configured to point inwards to the flesh of the ear. The hearing device 2 is configured to be arranged at the concha of the ear.

Figure 7:
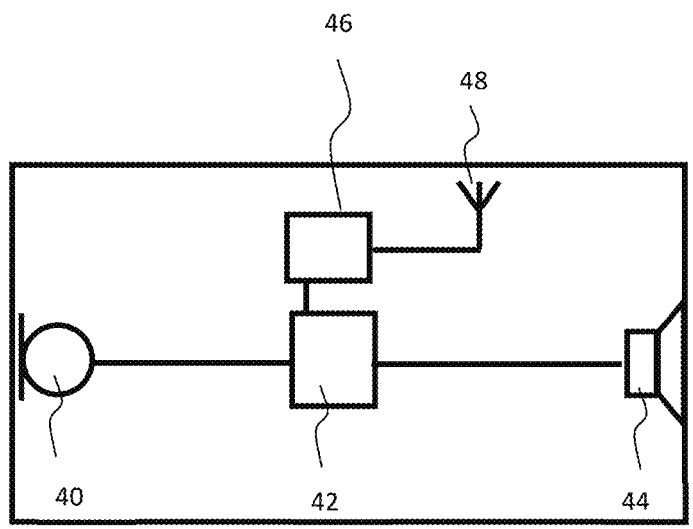
FIG. 7 schematically illustrates an example of a hearing device, such as a hearing aid.

FIG. 7 schematically illustrates an example of a hearing device 2, such as a hearing aid. The hearing device 2 comprises a microphone 40, for receiving an input signal and converting it into an audio signal. The audio signal is provided to a processing unit 42 for processing the audio signal and providing a processed output signal for compensating a hearing loss of a user of the hearing device 2. An output transducer 44 is connected to an output of the processing unit 42 for converting the processed output signal into an output sound signal, e.g. a signal modified to compensate for a user's hearing impairment. The output transducer 44 is often referred to as a receiver or speaker. The processing unit 42 may comprise elements such as amplifiers, compressors, noise reduction systems, etc. The hearing device 2 may further comprise a wireless communication unit 46 for wireless data communication interconnected with an antenna element/structure 48 for emission and reception of an electromagnetic field. The wireless communication unit 46, such as a radio or a transceiver, connects to the processing unit 42 and the antenna structure 48, for communicating with an electronic device, an external device, or with another hearing device, such as another hearing aid located in/on/at another ear of the user, typically in a binaural hearing system. The hearing device 2 may comprise two or more antenna structures.

The hearing device 2 may be an in-the-ear hearing device and may be provided as an in-the-ear module. Alternatively, parts of the hearing device 2 may be provided in a behind-the-ear module, while other parts, such as the output transducer 44, may be provided in an in-the-ear module.

Figure 8A:
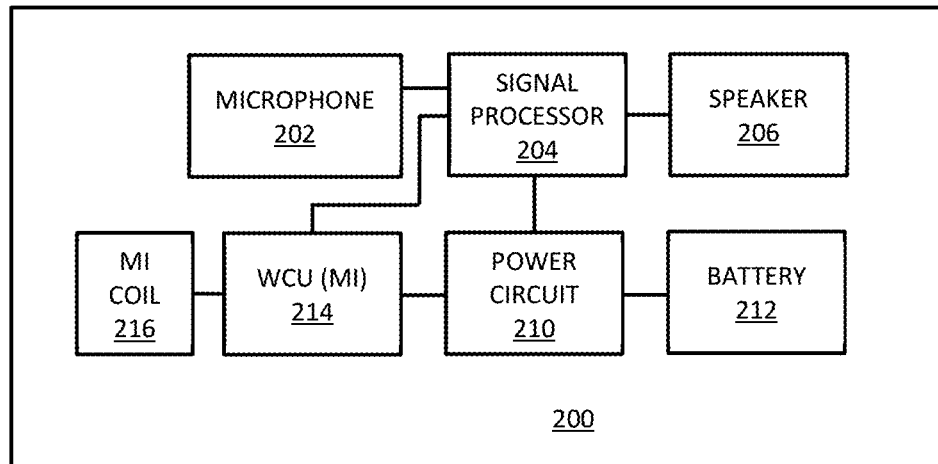
FIGS. 8a) and 8b) schematically illustrate an example of a block-diagram of an embodiment of a hearing device.

FIGS. 8a) and 8b) schematically illustrate an example of a block-diagram of an embodiment of a hearing device 200. In FIG. 8a), the hearing device 200 comprises a first transducer, i.e. microphone 202, to generate one or more microphone output signals based on a received an audio signal. The one or more microphone output signals are provided to a signal processor 204 for processing the one or more microphone output signals. An output transducer or receiver or speaker 206 is connected to an output of the signal processor 204 for converting the output of the signal processor into a signal modified to compensate for a user's hearing impairment, and provides the modified signal to the speaker 206.

The hearing device signal processor 204 may comprise elements such as an amplifier, a compressor and/or a noise reduction system etc. The signal processor 204 may be implemented in a signal processing chip 204'. The hearing device may further have a filter function, such as compensation filter for optimizing the output signal.

The hearing device further comprises a wireless communication unit 214 interconnected with magnetic induction antenna 216 such as a magnetic induction coil.

The wireless communication unit 214 and the magnetic induction antenna 216 may be configured for wireless data communication using emission and reception of magnetic field. The wireless communication unit may be implemented as a wireless communication chip 214', such as a magnetic induction control chip 214'. The hearing device 200 further comprises a power source 212, such as a battery or a rechargeable battery. Furthermore, a power management unit 210 is provided for controlling the power provided from the battery 212 to the signal processor 204, the output transducer, the one or more microphones, the wireless communication unit (RF) 208, and the wireless communication unit (MI) 214. The magnetic induction antenna is configured for communication with another electronic device, in some embodiments configured for communication with another hearing device, such as another hearing device located at another ear, typically in a binaural hearing device system.

The hearing device may furthermore have a wireless communication unit 208, such as a wireless communication circuit, for wireless data communication interconnected with an RF antenna 218 for emission and reception of an electromagnetic field. The wireless communication unit may be implemented as a wireless communication chip 208'. The wireless communication unit 208, including a radio or a transceiver, connect to the hearing device signal processor 204 and the RF antenna 218, for communicating with one or more external devices, such as one or more external electronic devices, including at least one smart phone, at least one tablet, at least one hearing accessory device, including at least one spouse microphone, remote control, audio testing device, etc., or, in some embodiments, with another hearing device, such as another hearing device located at another ear, typically in a binaural hearing device system.

The signal processor 204, the wireless communication unit (RF) 208, the wireless communication unit (MI) 214 and the power management unit 210 may be implemented as signal processing chip 204', wireless communication chip (RF) 208', wireless communication chip (MI) 214' and power management chip 210', respectively.

Figure 8B:
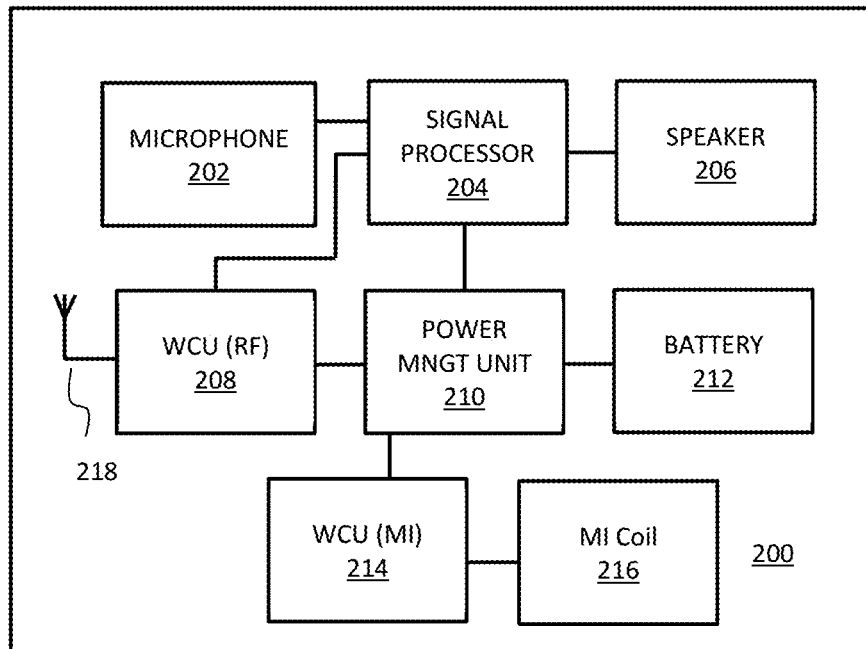

In FIG. 8b), a hearing device corresponding to the hearing device as shown in FIG. 8a) is seen, except that in FIG. 8b), only one wireless communication unit 214 is present being interconnected with the magnetic induction antenna 216, the signal processor 204 and the power management unit 210.

Likewise, even though not shown, also a hearing device having only one wireless communication unit 208 being interconnected with an RF antenna for reception and emission of an electromagnetic field is envisaged.

Although particular features have been shown and described, it will be understood that they are not intended to limit the claimed invention, and it will be made obvious to those skilled in the art that various changes and modifications may be made without departing from the scope of the claimed invention. The specification and drawings are, accordingly to be regarded in an illustrative rather than restrictive sense. The claimed invention is intended to cover all alternatives, modifications and equivalents.

Items

1. A hearing device configured to be worn in an ear of a user, the hearing device being configured to provide an audio signal to the user, the hearing device comprising:
    a circuit assembly, comprising:
        a printed circuit board assembly, comprising:
            a first circuit board;
            a second circuit board;

a third circuit board interconnected with the first circuit board and the second circuit board;
a battery, and
an output transducer for providing the audio signal, wherein the printed circuit board assembly is folded about the battery and the output transducer.

2. A hearing device according to any of the preceding items, wherein the first and second circuit boards are printed circuit boards, and wherein the third circuit board is a flexible circuit board.

3. A hearing device according to any of the preceding items, wherein the first circuit board and second circuit board are arranged opposite each other.

4. A hearing device according to any of the preceding items, wherein the battery comprises a first major face, a second major face and one or more side faces; and wherein the printed circuit board assembly is folded about the battery with the first circuit board adjacent the first major face, the second circuit board adjacent the second major face, and the third circuit board adjacent at least one of the one or more side faces.

5. A hearing device according to any of the preceding items, wherein the output transducer is provided adjacent the third circuit board.

6. A hearing device according to any of the preceding items, wherein the output transducer and the battery are aligned between the first and the second circuit board.

7. A hearing device according to any of the preceding items, wherein the output transducer is arranged adjacent at least one of the one or more side faces of the battery.

8. A hearing device according to any of the preceding items, wherein the output transducer is arranged between the battery and the third circuit board.

9. A hearing device according to any of the preceding items, further comprising a magnetic induction coil, wherein the magnetic induction coil is provided opposite the output transducer; and wherein the battery is arranged between the magnetic induction coil and the output transducer.

10. A hearing device according to any of the preceding items, wherein the output transducer comprises a protrusion for providing a sound output, and wherein the second circuit board comprises a hole and wherein the protrusion extends through the hole.

11. A hearing device according to any of the preceding items, further comprising a frame for suspending the output transducer within the printed circuit board assembly.

12. A hearing device according to any of the preceding items, wherein the frame comprises foam surrounding the output transducer.

13. A hearing device according to any of the preceding items, further comprising one or more microphones and/or one or more control interfaces, wherein the one or more microphones and/or the one or more control interfaces are provided on the first circuit board.

14. A hearing device according to any of the preceding items, further comprising an antenna comprising an antenna element, the antenna being configured for emission and reception of electromagnetic radiation at a wavelength ($\lambda$); and where the hearing device further comprises a wireless communication unit interconnected with the antenna element.

15. A hearing device according to any of the preceding items, wherein, during operational use of the hearing device, the circuit assembly is arranged such that the third circuit board is provided adjacent the tragus in the ear.

16. A hearing device according to any of the preceding items, wherein, during operational use of the hearing device, the circuit assembly is arranged such that a first surface of the first circuit board faces towards the surroundings outside of the ear, and a second surface of the first circuit board faces towards the concha of the ear, where the first surface is opposite to the second surface.

17. A hearing device according to any of the preceding items, further comprising a fourth circuit board and power management components, wherein the power management components are provided at the fourth circuit board.

LIST OF REFERENCES 2 hearing device
4 circuit assembly
6 printed circuit board assembly
8 first circuit board
8' first surface of first circuit board
8" second surface of first circuit board
10 second circuit board
10' first surface of second circuit board
10" second surface of second circuit board
12 third circuit board
16 battery
40 microphone
42 processing unit
44 output transducer
46 wireless communication unit
48 antenna element/structure
50 magnetic induction coil
52 protrusion of output transducer
54 hole in second circuit board
200 hearing device
202 first transducer
204 signal processor
206 output transducer
208 wireless communication unit/chip (RF)
210 power management components
214 wireless communication unit/chip (MI)
216 magnetic induction antenna
218 radio frequency (RF) antenna

The invention claimed is:

1. A hearing device configured to be worn in an ear of a user, the hearing device being configured to provide an audio signal to the user, the hearing device comprising:
a printed circuit board assembly, comprising:
a first circuit board,
a second circuit board, and
a third circuit board connected with the first circuit board and the second circuit board;
a battery; and
an output transducer configured to provide the audio signal;
wherein the printed circuit board assembly is folded about the battery and the output transducer; and
wherein the battery and at least a part of the output transducer is located between the first circuit board and the second circuit board.

2. The hearing device according to claim 1, wherein the first circuit board and second circuit boards are printed circuit boards, and wherein the third circuit board is a flexible circuit board.

3. The A hearing device according to claim 1, wherein the first circuit board and second circuit board are opposite from each other.

4. The hearing device according to claim 1, wherein the battery comprises a first major face, a second major face, and one or more side faces; and wherein the printed circuit board assembly is folded about the battery with the first circuit board facing towards the first major face, with the second circuit board facing towards the second major face, and with the third circuit board facing towards at least one of the one or more side faces.

5. The hearing device according to claim 4, wherein the output transducer faces towards at least one of the one or more side faces of the battery.

6. The hearing device according to claim 1, wherein the output transducer is closer to the third circuit board than to the first circuit board.

7. The hearing device according to claim 1, further comprising a frame configured to suspend the output transducer in a space defined by the printed circuit board assembly.

8. The hearing device according to claim 7, wherein the frame comprises foam surrounding the output transducer.

9. The hearing device according to claim 1, further comprising one or more microphones and/or one or more control interfaces, wherein the one or more microphones and/or the one or more control interfaces are at the first circuit board.

10. The hearing device according to claim 1, further comprising an antenna having an antenna element, the antenna being configured for electromagnetic radiation emission at a wavelength (A) and electromagnetic radiation reception at the wavelength, and where the hearing device further comprises a wireless communication unit coupled with the antenna element.

11. The hearing device according to claim 1, wherein the third circuit board is oriented in the hearing device such that when the hearing device is worn by the user, a tragus of the user is closer to the third circuit board than to the first and second circuit boards.

12. The hearing device according to claim 1, wherein the first circuit board, the second circuit board, and the third circuit board are parts of an unity structure.

13. The hearing device according to claim 1, wherein the first circuit board, the second circuit board, and the third circuit board comprise respective parts of a substrate.

14. The hearing device according to claim 1, wherein the third circuit board is connected between the first circuit board and the second circuit board.

15. A hearing device configured to be worn in an ear of a user, the hearing device being configured to provide an audio signal to the user, the hearing device comprising:
a printed circuit board assembly, comprising:
a first circuit board,
a second circuit board, and
a third circuit board connected with the first circuit board and the second circuit board;
a battery; and
an output transducer configured to provide the audio signal;
wherein the printed circuit board assembly is folded about the battery and the output transducer; and
wherein the output transducer and the battery are aligned, and are located between the first circuit board and the second circuit board.

16. A hearing device configured to be worn in an ear of a user, the hearing device being configured to provide an audio signal to the user, the hearing device comprising:
a printed circuit board assembly, comprising:
a first circuit board,
a second circuit board, and
a third circuit board connected with the first circuit board and the second circuit board;
a battery; and
an output transducer configured to provide the audio signal;
wherein the printed circuit board assembly is folded about the battery and the output transducer; and
wherein the output transducer is between the battery and the third circuit board.

17. A hearing device configured to be worn in an ear of a user, the hearing device being configured to provide an audio signal to the user, the hearing device comprising:
a printed circuit board assembly, comprising:
a first circuit board,
a second circuit board, and
a third circuit board connected with the first circuit board and the second circuit board;
a battery; and
an output transducer configured to provide the audio signal;
wherein the printed circuit board assembly is folded about the battery and the output transducer; and
wherein the hearing device further comprises a magnetic induction coil, wherein the battery is between the magnetic induction coil and the output transducer.

18. A hearing device configured to be worn in an ear of a user, the hearing device being configured to provide an audio signal to the user, the hearing device comprising:
a printed circuit board assembly, comprising:
a first circuit board,
a second circuit board, and
a third circuit board connected with the first circuit board and the second circuit board;
a battery; and
an output transducer configured to provide the audio signal;
wherein the printed circuit board assembly is folded about the battery and the output transducer; and
wherein the output transducer comprises a protrusion for providing a sound output, and wherein the second circuit board comprises a hole configured to accommodate the protrusion.

* * * * *